United States Patent [19]

Angerstein et al.

[11] Patent Number: 4,780,752
[45] Date of Patent: Oct. 25, 1988

[54] LUMINESCENT SEMICONDUCTOR COMPONENT

[75] Inventors: Jörg Angerstein, Flein; Werner Schairer, Weinsberg, both of Fed. Rep. of Germany

[73] Assignee: Telefunken electronic GmbH, Heilbronn, Fed. Rep. of Germany

[21] Appl. No.: 373,032

[22] Filed: Apr. 28, 1982

[30] Foreign Application Priority Data

May 4, 1981 [DE] Fed. Rep. of Germany ....... 3117571

[51] Int. Cl.4 .................. H01L 23/08; H01L 23/02
[52] U.S. Cl. ................................................. 357/72
[58] Field of Search .................. 357/72, 73, 17; 313/512, 499

[56] References Cited

U.S. PATENT DOCUMENTS

| | | | |
|---|---|---|---|
| 3,510,732 | 5/1970 | Amans | 357/72 X |
| 3,694,902 | 10/1972 | Apgar et al. | 357/72 X |
| 3,696,263 | 10/1972 | Wacher | 357/72 X |
| 3,780,357 | 12/1973 | Haitz | 357/72 |
| 3,919,585 | 11/1975 | Schorr | 313/512 X |
| 4,047,075 | 9/1977 | Schoberl | |
| 4,143,394 | 3/1979 | Schöberl | |
| 4,152,624 | 5/1979 | Knaebel | |
| 4,248,920 | 2/1981 | Yoshizumi et al. | 357/72 X |

FOREIGN PATENT DOCUMENTS

| | | |
|---|---|---|
| 2509047 | 9/1976 | Fed. Rep. of Germany . |
| 2227322 | 12/1980 | Fed. Rep. of Germany . |
| 138852 | 11/1979 | German Democratic Rep. . |
| 1482794 | 8/1977 | United Kingdom . |

Primary Examiner—Andrew J. James
Assistant Examiner—S. V. Clark
Attorney, Agent, or Firm—Spencer & Frank

[57] ABSTRACT

A luminescent semiconductor component has a casing member of a light transmissive plastics material containing particles which simultaneously determine the light scattering and filtering properties of the light which is emitted by the semiconductor component and passes out of the casing member. The casing member may be of epoxy resin, and the particles may be of colored ground filter glass.

1 Claim, 2 Drawing Sheets

LUMINESCENT SEMICONDUCTOR COMPONENT

BACKGROUND OF THE INVENTION

The present invention relates to a luminescent semiconductor component with a casing member containing a semiconductor body and comprising light transmissive plastics material.

Conventionally, the plastics material for the casing of a luminescent semiconductor component is dyed with organic dyes in order to improve the visibility of light emission from the semiconductor component, particularly during daylight conditions, and to make it more easily readable. Powdered glass or other solid scattering or dispersing materials, such as titanium oxide, zinc sulphide or $CaCO_3$ may be generally added as the scattering material. For example it is known to add powdered glass from German patent specification No. 22 27 322.

SUMMARY OF THE INVENTION

It is an object of the present invention to simplify the manufacture of luminescent semiconductor components by implementing certain component properties, previously achieved by various steps, in a single step.

According to the invention there is provided a luminescent semiconductor component comprising a semiconductor body and a casing member of light-transmissive plastics material, said casing member containing particles simultaneously determining the light scattering and filtering properties of said casing member with respect to light emitted by said body and passing through said casing member.

Further according to the invention there is provided an edge filter comprising a casing member of light-transmissive plastics material containing particles which simultaneously determine the light-scattering and filtering properties of the casing member.

BRIEF DESCRIPTION OF THE DRAWINGS

A preferred embodiment of the present invention will now be described by way of example only, with reference to the accompanying drawings, of which.

DESCRIPTION OF THE PREFERRED EMBODIMENTS

Basically the present invention provides a luminescent semiconductor component having a casing of light-transmissive plastics material containing particles which simultaneously determine the light scattering and filtering properties of the casing member with respect to light emitted by the component and passing through the casing member.

Thus the previously separate steps of dying the casing member and adding scattering particles, are combined by adding to the casing member particles which have predetermined properties with regard to scattering and filtering light. As a result the process of manufacturing luminescent semiconductor components is simplified and these components can be reproduced with consistent properties in an improved manner.

The plastics of the casing member may comprise a clear epoxy resin to which particles of dyed powdered glass are added. If high transmission is to be achieved the refractive index of the plastics material has to correspond as far as possible with that of the particle material. If, on the other hand, elevated scattering of the light in the casing is desired, then the material of the casing plastics and of the particles added have different refractive indices.

The particles which are added may comprise a ground filter glass in which the grain size is preferably less than 50 μm. Up to approximately 20% by volume of particles which affect the scattering and filtering characteristics are added to the mouldable plastics.

Figure 1:
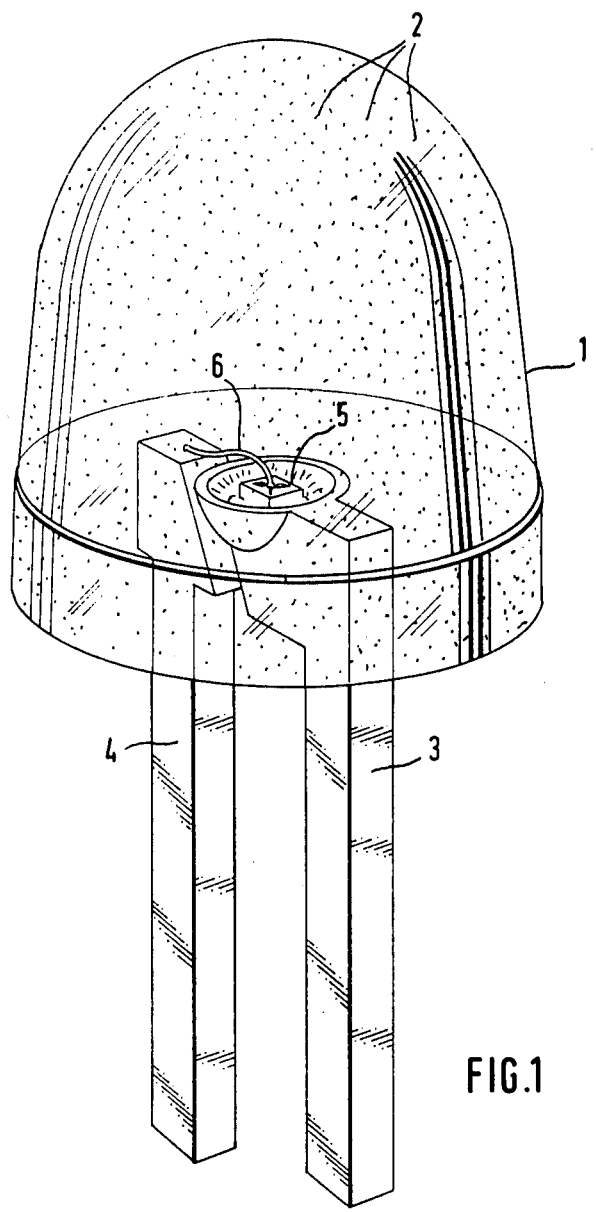
FIG. 1 is a perspective view of a luminescent semiconductor component in accordance with the present invention.

Referring now to FIG. 1 there is shown a single luminescent semiconductor component (e.g. a diode) comprising a plastics casing member 1 and two electrical leads 3 and 4 leading out of the plastics casing. Inside the casing member the semiconductor component 5 is electrically connected to the supply lead 3. The second electrode connection of the light emitting semiconductor diode is connected in electrically conductive fashion to the second supply lead 4 via a connecting wire 6.

The casing member may, for example, comprise epoxy resin with a refractive index of $n_d = 1.5$. However other commercially available mouldable plastics materials can be considered, preferably those which are clear and have a refractive index in the region of between 1.45 and 1.6.

The added particles 2 are located in the plastics member 1 and determine the transmission and/or filtering characteristics and the scattering property of the light emitted by the semiconductor component 5. These particles 2 may for example comprise a ground filter glass. A red filter glass obtainable under the name RG630 may be employed. The casing member 1 preferably comprises 2–4% by volume of added particles which have a grain size of approximately 1 μm.

The refractive index of the glass or other added particles can be adapted to the refractive index of the plastics to a greater or lesser extent depending on the desired dispersion effect. The glass used preferably has a refractive index of between 1.3 and 2. If the refractive index of the respective particle material is identical or almost identical to that of the respective plastics, then there is very little scattering dispersion of the radiated light and therefore there is particularly good transmission. The greater the divergence between the refractive indices, the greater the scattering of the light in the plastics member, so that the light source appears diffused to the observer.

Figure 2:
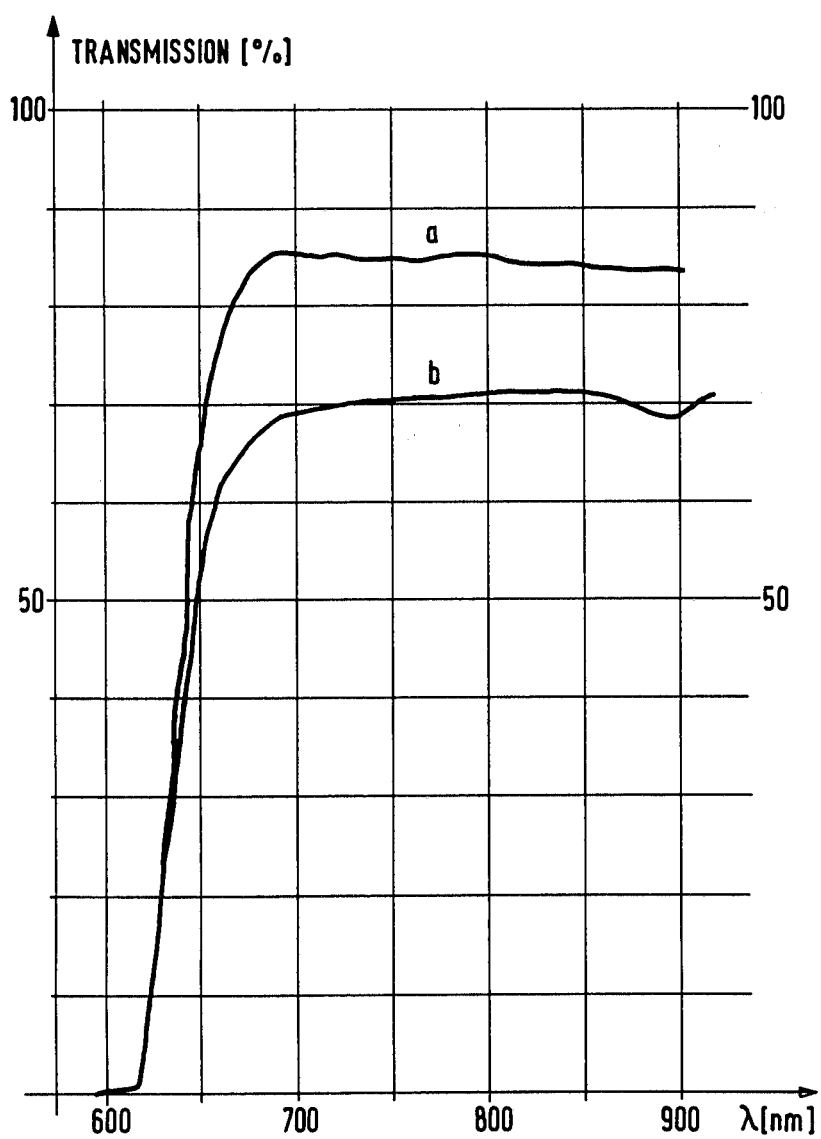
FIG. 2 is a graph showing various light transmission curves related to the component of FIG. 1.

In FIG. 2 there is shown the path of the transmission curves against wavelength for a red filter glass and for a plastics casing member in which particles comprising a ground red filter glass are embedded in the plastics member. Curve (a) shows the path of the transmission over the wavelength for pure red filter glass with the trade name RG630. This glass is an edge filter, since almost all wavelengths under 630 nm are eliminated. At approximately 630 nm the transmission rises sharply from 0 to approximately 85%.

Curve (b) shows the transmission curve against wavelength of a plastics member comprising epoxy resin with the trade name OS1600, to which approximately 2% by volume of ground red filter glass of the type RG630 has been added. As is apparent from this curve the transmission is in fact reduced to just over 70% at its maximum; apart from this, however, the same function curve, characteristic of an edge filter, is achieved. The particles added determine both the filtering characteristics and the scattering of the radiated light. Changes in these properties can be achieved by changing the grain size of the particles added, the type of glass and the mixture ratio.

The composition of casing members for luminescent semiconductor components may be used to produce filters for detectors, band filters or edge filters with a steep flank. The shaping of the casing members can be modified to be suitable for light emitting semiconductor components in discrete or integrated form e.g. for displaying digits, letters or other characters.

It will be understood that the above description of the present invention is susceptible to various modifications changes and adaptations.

What is claimed is:

1. A luminescent semiconductor component comprising a light emitting semiconductor body and a casing member of light-transmissive plastics material enclosing said body, said casing member containing up to 20% by volume of particles which are comprised of a colored glass powder and which simultaneously determine the light scattering and filtering properties of said casing member with respect to light emitted by said body and passing through said casing member, and wherein the refractive index of said plastics material is substantially different from that of the material of said particles.

* * * * *